(12) United States Patent
Oh et al.

(10) Patent No.: US 11,810,887 B2
(45) Date of Patent: Nov. 7, 2023

(54) DOUBLE-SIDED COOLING TYPE POWER MODULE AND MANUFACTURING METHOD THEREFOR

(71) Applicant: LG Electronics Inc., Seoul (KR)

(72) Inventors: Heoncheol Oh, Seoul (KR); Jaesang Min, Seoul (KR); Yonghee Park, Seoul (KR); Jinwoo Lee, Seoul (KR); Heejin Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 220 days.

(21) Appl. No.: 16/982,431

(22) PCT Filed: Oct. 19, 2018

(86) PCT No.: PCT/KR2018/012402
§ 371 (c)(1),
(2) Date: Sep. 18, 2020

(87) PCT Pub. No.: WO2019/182216
PCT Pub. Date: Sep. 26, 2019

(65) Prior Publication Data
US 2021/0057372 A1    Feb. 25, 2021

(30) Foreign Application Priority Data
Mar. 20, 2018  (KR) .................. 10-2018-0032267

(51) Int. Cl.
*H01L 23/00*    (2006.01)
*H01L 23/373*    (2006.01)
*H02M 7/00*    (2006.01)

(52) U.S. Cl.
CPC .......... *H01L 24/32* (2013.01); *H01L 23/3735* (2013.01); *H02M 7/003* (2013.01)

(58) Field of Classification Search
CPC ........... H01L 23/3735; H01L 23/49575; H01L 23/49811; H01L 25/072; H01L 23/49844;
(Continued)

(56) References Cited

U.S. PATENT DOCUMENTS 6,072,240 A * 6/2000 Kimura ................. H01L 25/072
257/692
6,255,672 B1 * 7/2001 Yoshioka .............. H01L 25/072
257/107
(Continued)

FOREIGN PATENT DOCUMENTS

CN    101847620    9/2010
CN    103378048    10/2013
(Continued)

OTHER PUBLICATIONS

Notice of Allowance in Japanese Appln. No. 2020550787, dated Dec. 6, 2022, 4 pages (with Machine translation).
(Continued)

*Primary Examiner* — Mouloucoulaye Inoussa
(74) *Attorney, Agent, or Firm* — Fish & Richardson P.C.

(57) ABSTRACT

A power module includes a first substrate including a first metal plate, a second substrate spaced apart from the first substrate and having a second metal facing the first substrate, a plurality of power elements that are disposed between the first substrate and the second substrate and include a first electrode and a second electrode. The plurality of power elements include a first power element having the first electrode bonded to the second metal plate, and a second power element having the first electrode bonded to the first metal plate.

14 Claims, 17 Drawing Sheets

(58) Field of Classification Search
CPC ......... H01L 23/49531; H01L 23/49562; H01L 25/18; H01L 23/49833; H01L 24/32; H01L 25/50; H01L 24/33; H01L 24/83; H01L 24/06; H01L 25/07; H01L 23/4334; H01L 24/97; H01L 23/492; H01L 24/73; H01L 24/48; H01L 23/49524; H01L 23/49541; H01L 23/5384; H01L 23/5389; H01L 21/486; H01L 23/5386; H01L 21/4853; H01L 24/82; H01L 21/78; H01L 24/25; H01L 23/5385; H01L 23/055; H01L 21/4825; H01L 21/565; H01L 23/3142; H01L 24/84; H01L 21/4882; H01L 23/49568; H01L 24/40; H01L 23/49513; H01L 24/37; H01L 2224/32238; H01L 2224/06051; H01L 2224/83801; H01L 2224/33181; H01L 2224/83986; H01L 2224/0603; H01L 2224/32245; H01L 2224/04026; H01L 2224/06181; H01L 2224/8384; H01L 2224/0615; H01L 2924/13055; H01L 2224/33; H01L 2924/30107; H01L 2924/10272; H01L 2924/1033; H01L 2224/8346; H01L 2924/10253; H01L 2224/48247; H01L 2924/00014; H01L 2924/12032; H01L 2924/181; H01L 2224/73215; H01L 2224/83424; H01L 2224/04042; H01L 2924/351; H01L 2224/73265; H01L 2924/13091; H01L 2224/83447; H01L 2924/10271; H01L 2224/97; H01L 2924/00012; H01L 2224/73221; H01L 2224/40139; H01L 2224/49171; H01L 2224/37139; H01L 2224/48137; H01L 2224/40245; H01L 2224/37147; H01L 2224/48091; H01L 2924/1305; H01L 2224/45099; H01L 2924/12042; H01L 2224/82039; H01L 2224/04105; H01L 2224/24137; H01L 2224/32225; H01L 2224/83005; H01L 2224/92144; H01L 2224/37013; H01L 2224/37644; H01L 2224/45144; H01L 2924/3511; H01L 2224/82001; H05K 7/209; H05K 1/185; H05K 7/2039; H05K 1/11; H05K 3/4608; H05K 3/30; H05K 1/188; H02M 7/003; H02M 7/48

USPC ....... 257/401, 777, 676, 691, 712, 328, 177, 257/668, 107, 133, 142, 138, 735, 736, 257/692, 705, 758, E21.506, E23.175, 257/E25.018, E23.051, E23.141, E23.101, 257/E25.023, E23.172, E25.016; 438/109, 121

See application file for complete search history.

(56) References Cited

U.S. PATENT DOCUMENTS

| | | | |
|---|---|---|---|
| 8,884,420 B1* | 11/2014 | Hosseini | H01L 24/37 257/676 |
| 9,468,087 B1 | 10/2016 | Joshi | |
| 10,079,193 B2 | 9/2018 | Mohn et al. | |
| 2004/0119148 A1* | 6/2004 | Standing | H01L 25/072 257/668 |
| 2006/0163648 A1* | 7/2006 | Hauenstein | H01L 25/072 257/E23.012 |
| 2007/0018197 A1* | 1/2007 | Mochida | H01L 25/105 257/E25.023 |
| 2009/0072384 A1* | 3/2009 | Wong | H01L 25/0655 257/E23.101 |
| 2010/0078783 A1* | 4/2010 | Otremba | H01L 23/142 257/676 |
| 2010/0301496 A1* | 12/2010 | Koduri | H01L 24/73 216/36 |
| 2011/0062600 A1 | 3/2011 | Ueno et al. | |
| 2011/0108971 A1* | 5/2011 | Ewe | H01L 23/5389 438/109 |
| 2013/0003309 A1* | 1/2013 | Stella | H01L 24/32 361/715 |
| 2013/0020694 A1* | 1/2013 | Liang | H01L 23/473 257/691 |
| 2013/0113090 A1* | 5/2013 | Atsumi | H01L 23/49575 257/676 |
| 2013/0146991 A1* | 6/2013 | Otremba | H01L 24/96 438/109 |
| 2014/0035112 A1* | 2/2014 | Kadoguchi | H01L 23/49575 438/123 |
| 2014/0264804 A1* | 9/2014 | Terrill | H01L 24/34 257/676 |
| 2014/0273344 A1* | 9/2014 | Terrill | H01L 23/49575 438/107 |
| 2015/0131232 A1* | 5/2015 | Ishino | H05K 1/185 361/707 |
| 2015/0223366 A1* | 8/2015 | Horiuchi | H05K 7/20254 361/689 |
| 2015/0382501 A1* | 12/2015 | Horiuchi | H05K 7/2089 363/131 |
| 2016/0020194 A1* | 1/2016 | Gottwald | H01L 24/25 257/774 |
| 2016/0027711 A1* | 1/2016 | Harada | H01L 23/49827 257/698 |
| 2017/0018484 A1* | 1/2017 | Kadoguchi | H01L 23/49562 |
| 2017/0077068 A1 | 3/2017 | Horio et al. | |
| 2017/0294403 A1* | 10/2017 | Palm | H01L 23/5384 |
| 2018/0022220 A1* | 1/2018 | Xu | B60L 50/51 307/10.1 |
| 2018/0337107 A1* | 11/2018 | Kida | H01L 24/42 |
| 2019/0181078 A1* | 6/2019 | Yamamoto | H01L 23/49524 |

FOREIGN PATENT DOCUMENTS

| | | |
|---|---|---|
| JP | 2006-165322 | 6/2006 |
| JP | 2012174711 | 9/2012 |
| JP | 2013016623 | 1/2013 |
| JP | 2013041939 | 2/2013 |
| JP | 2015225918 | 12/2015 |
| JP | 2016039206 | 3/2016 |
| JP | 2017034152 | 2/2017 |
| JP | 2017163135 | 9/2017 |
| KR | 10-2017-0069322 | 6/2017 |
| KR | 1020170092750 | 8/2017 |
| KR | 10-2017-0105284 | 9/2017 |
| WO | WO2012132709 | 10/2012 |

OTHER PUBLICATIONS

Extended European Search Report in European Appln. No. 18910764.2, dated Nov. 15, 2021, 12 pages.

Office Action in Japanese Appln. No. 2020-550787, dated Dec. 7, 2021, 7 pages (with English translation).

Office Action in Chinese Appln. No. 201880091434.3, dated Apr. 28, 2023, 26 pages (with English translation).

* cited by examiner

DOUBLE-SIDED COOLING TYPE POWER MODULE AND MANUFACTURING METHOD THEREFOR

CROSS-REFERENCE TO RELATED APPLICATIONS

This application is a National Stage application under 35 U.S.C. § 371 of International Application No. PCT/KR2018/012402, filed on Oct. 19, 2018, which claims the benefit of Korean Patent Application No. 10-2018-0032267, filed on Mar. 20, 2018. The disclosures of the prior applications are incorporated by reference in their entirety.

TECHNICAL FIELD

The present disclosure relates to a double-sided cooling type power module for vehicle such as an electric vehicle, a hybrid vehicle, and a fuel cell vehicle, and for a home appliance such as an air conditioner, and a method for manufacturing the same.

BACKGROUND

Vehicles may include an eco-friendly vehicle such as an electric vehicle, a hybrid vehicle, and a fuel cell vehicle, and a home appliance may include an air conditioner. The vehicles and home appliance may include a motor as a driving unit. In some cases, a motor may be driven by three-phase current transmitted through a power cable from an inverter that converts a direct current (DC) voltage into a three-phase voltage by a pulse width modulation (PWM) signal of a controller.

The inverter may include a power element that performs an operation of supplying power for driving the motor using power supplied from a power supply. The power element may supply power for driving the motor through a switching operation. In some cases, a gate turn-off thyristor (GTO) semiconductor element may be used as the power element. In some cases, an insulated gate bipolar transistor (IGBT) semiconductor element may be used.

During the switching operation of the power element, temperatures inside the power element and a power module including the power element may increase. As the internal temperatures may become excessively high, the power element may be damaged. When the power element is damaged, the motor may not operate normally. Accordingly, in order to prevent or reduce overheating of the power element and the power module, an appropriate cooling method may be introduced.

For example, the power module including the power element may include a heatsink for cooling a chip assembly during the switching operation. The heatsink may include a single-sided heatsink attached to any one surface of top and bottom surfaces of the chip assembly and a double-sided heatsink attached to both surfaces.

In some cases, the double-sided cooling type power module having the double-sided heatsink may be used rather than the single-sided cooling type power module having the single-sided heatsink.

In some cases, the double-sided cooling type power module in related art may include a connection member such as a wire for connecting a gate electrode of upper electrodes of the power element to a signal pin or terminal. Due to the use of the connection member, it may be difficult to implement a compact power module, and as an additional connection process is added, it may be difficult to simplify the process and reduce a manufacturing time.

SUMMARY

The present disclosure describes a double-sided cooling type power module which is capable of being manufactured without a connection member such as a wire for connecting a gate electrode of a power element to a signal pin or terminal to simplify a manufacturing process, reduce a manufacturing time, and realize a more compact size thereof.

According to one aspect of the subject matter described in this application a power module includes a first substrate including a first metal plate disposed at a first side of the first substrate, a second substrate spaced apart from the first substrate, where the second substrate includes a second metal plate that is disposed at a second side of the second substrate and faces the first metal plate, and a plurality of power elements disposed between the first substrate and the second substrate. Each of the plurality of power elements includes a first electrode disposed at a first surface of each of the plurality of power elements, and a second electrode disposed at a second surface of each of the plurality of power elements. The plurality of power elements includes a first power element having the first electrode coupled to the second metal plate, and a second power element having the first electrode coupled to the first metal plate.

Implementations according to this aspect may include one or more of the following features. For example, the plurality of power elements comprise insulated gate bipolar transistor (IGBT) semiconductor elements. The first electrode may include a gate electrode and an emitter electrode of one of the IGBT semiconductor elements, and the second electrode may include a collector electrode of the one of the IGBT semiconductor elements.

In some implementations, the power module may include a signal pin and a terminal, where the first and second metal plates may include a portion bonded to the gate electrode, and another portion bonded to the signal pin or the terminal. In some examples, the gate electrode may be connected to the signal pin or terminal without a wire. In some examples, the first metal plate may be electrically connected to the collector electrode of the first power element and the emitter electrode of the second power element.

In some implementations, the power module may include a spacer bonded to the collector electrode of the first power element or the second power element, and the first metal plate may be bonded to the emitter electrode of the second power element and to the spacer that is bonded to the collector electrode of the first power element.

In some implementations, the power module may include a signal pin and a terminal, where the first metal plate may include a plurality of first metal plates, and one of the plurality of first metal plates may define at least one first slit and be coupled to the signal pin and the terminal. The second metal plate may include a plurality of second metal plates, where one of the plurality of second metal plates may define at least one second slit and be coupled to the signal pin and the terminal. In some examples, the one of the plurality of first metal plates may include a plurality of metal plates divided by the at least one first slit.

In some implementations, the first and second metal plates may be disposed at opposing surfaces of the first substrate and the second substrate.

In some implementations, the power module may include a signal pin and a terminal that extend outside the first and second substrates, where at least one of the signal pin or the terminal may be bent with respect to the first substrate or the second substrate. In some implementations, the power module may include an insulation portion that is disposed between the first substrate and the second substrate and that covers side surfaces of the first metal plate, the second metal plate, and the plurality of power elements.

In some implementations, the first metal plate may include a plurality of first metal plates spaced apart from one another and arranged along a first surface of the first substrate, and the second metal plate may include a plurality of second metal plates spaced apart from one another and arranged along a second surface of the second substrate facing the first surface of the first substrate.

In some implementations, the power module may include a spacer disposed between the first metal plate and the second metal plate, and a plurality of bonding portions disposed on at least one of the spacer, the plurality of power elements, the first metal plate, or the second metal plate. In some examples, the spacer may include a plurality of spacers that are arranged along the first metal plate or the second metal plate, and that include a first spacer disposed at the first power element and a second spacer disposed at the second power element. The plurality of bonding portions include a first boding portion that couples the first electrode of the first power element to the second metal plate, that couples the second electrode of the first power element to the first spacer, and that couples the first spacer to the first metal plate, and a second boding portion that couples the first electrode of the second power element to the first metal plate, that couples the second electrode of the second power element to the second spacer, and that couples the second spacer to the second metal plate.

According to another aspect, a method for manufacturing a power module includes printing a bonding material on opposing surfaces of a first substrate and a second substrate, mounting a plurality of power elements on the bonding material between the first substrate and the second substrate, and sintering the bonding material to bond the plurality of power elements to the first substrate and the second substrate. Mounting the plurality of power elements includes mounting a first power element of the plurality of power elements on the bonding material such that the first power element has a first electrode facing the second substrate, and mounting a second power element of the plurality of power elements such that the second power element has a first electrode facing the first substrate.

Implementations according to this aspect may include one or more of the following features. For example, the plurality of power elements include insulated gate bipolar transistor (IGBT) semiconductor elements. The first electrode of each of the first power element and the second power element may include a gate electrode and an emitter electrode of one of the IGBT semiconductor elements, and each of the first power element and the second power element further may include a second electrode corresponding to a collector electrode of the one of the IGBT semiconductor elements. Mounting the first power element may include placing the first power element such that the gate electrode and the emitter electrode of the first power element face the second substrate and the collector electrode of the first power element faces the first substrate.

In some implementations, mounting the plurality of power elements may include mounting the plurality of power elements, a plurality of diodes, and a lead frame between the first substrate and the second substrate, where the lead frame includes signal pins and terminals. In some examples, sintering may include bonding a portion of a metal plate of each of the first substrate and the second substrate to one gate electrode of the plurality of power elements, and bonding another portion of the metal plate to the signal pins or the terminals.

In some implementations, the method may further include molding an insulation material between the sintered first and second substrates, cutting a portion of the lead frame outside the signal pins and terminals, forming the signal pins and the terminals into a preset shape, and molding the insulation material for insulation of the signal pins and the terminals. In some examples, forming the signal pins and the terminals may include bending the signal pins or the terminals into the preset shape.

In some implementations, since the metal plate on the upper substrate and the lower substrate may connect the gate electrode of the power element to the signal pin to provide the power module that does not include a separate wire for connection. Accordingly, it may be possible to manufacture the more compact power module.

In some implementations, since the separate wire connection process is not performed, and the bonding of the substrates and the power elements is possible through only the single sintering process, not only the manufacturing process may be simplified, but also the manufacturing time may be effectively reduced.

In some implementations, since the first power element and the second power element are disposed to face the different directions, the one metal plate of the upper substrate may be electrically connected to the collector electrode of the first power element and the emitter electrode of the second power element to more easily realize the half bridge circuit.

In some implementations, the slit may help to prevent the substrate from being deformed by the heat during the expansion may be formed in the metal plate, which is bonded to the signal pin and terminal, among the metal plates of each of the substrates. Accordingly, the breakage or damage by the deformation of the substrate due to the difference in thermal expansion coefficient between the metal plate and the ceramic substrate may be avoided.

DETAILED DESCRIPTION

Hereinafter, one or more implementations are described with reference to the accompanying drawings, and the same or corresponding components are given with the same drawing number regardless of reference number, and their duplicated description will be omitted.

Hereinafter, exemplary implementations of the present disclosure will be described in detail with reference to the accompanying drawings.

Figure 1A:
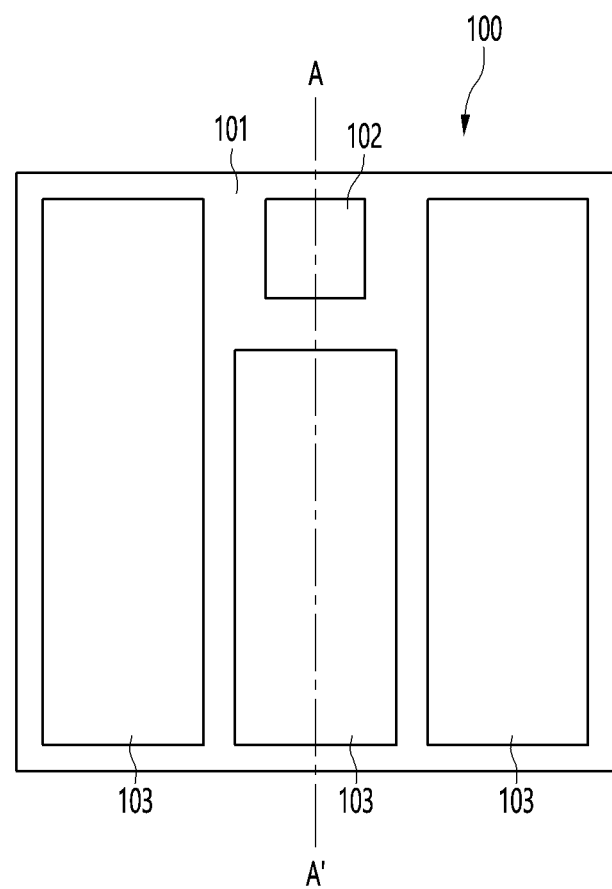
FIGS. 1A to 1C are views illustrating an example of a power element of a power module.
Figure 1B:
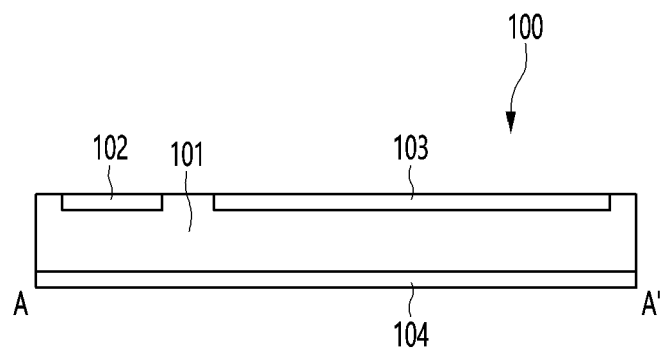
Figure 1C:
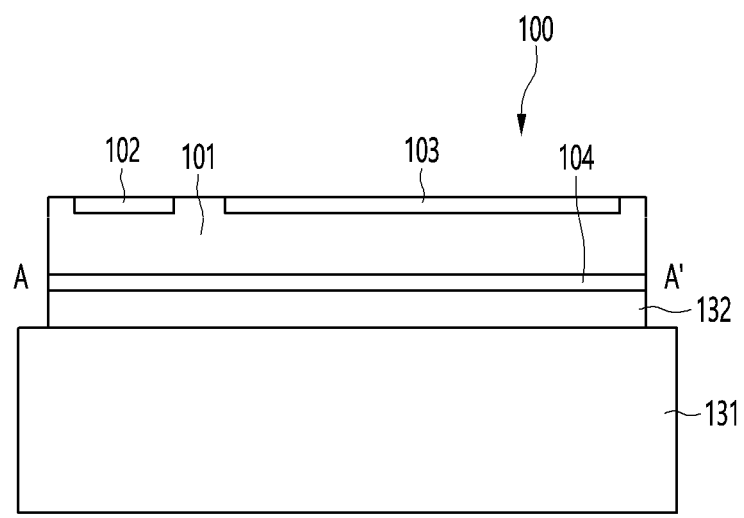

FIGS. 1A to 1C are views illustrating an example of a power element provided in a power module.

Referring to FIGS. 1A to 1C, a power element 100 and a power module including the power element 100 may perform an operation of converting power supplied from a power supply (battery, etc.) into power for driving a motor through a switching operation to supply the converted power.

For example, in some implementations, the power element 100 may be implemented as an insulated gate bipolar transistor (IGBT) semiconductor, but is not limited thereto.

The power element 100 may include a semiconductor layer 101, first electrodes 102 and 103, and a second electrode 104. In some examples, the semiconductor layer 101 may correspond to a semiconductor substrate or include a plurality of semiconductor layers.

The first electrodes 102 and 103 may be disposed on a first surface of the semiconductor layer 101 (for example, a top surface of the semiconductor layer 101), and the second electrode 104 may be disposed on a second surface (for example, a bottom surface of the semiconductor layer 101) that is opposite to the first surface. The first electrodes 102 and 103 may correspond to upper electrodes of the power element 100, and the second electrode 104 may correspond to a lower electrode of the power element 100.

In some implementations, the power element 100 may include a gate electrode 102 and an emitter electrode 103 as the first electrodes and a collector electrode 104 as the second electrode. In other implementations, the first electrodes and the second electrode may have various shapes and types of electrodes.

A spacer 131 may be bonded to one surface (for example, a surface on which the second electrode 104 is disposed) of the power element 100. In order to bond the spacer 131 to the one surface, a bonding portion 132 may be disposed between the one surface and the spacer 131. The bonding portion 132 may be provided in a shape in which a bonding material that is a conductive material such as solder or silver (Ag) is printed on the one surface (for example, the second electrode 104), and the spacer 131 is bonded to one surface of the power element 100 by a soldering or sintering method.

The spacer 131 may have high thermal conductivity, low thermal resistance, and low electrical resistance to prevent or reduce deterioration of electrical conductivity and transfer heat generated by the power element 100 to the outside. For example, the spacer 131 may be implemented with a material such as Al—Si—C, Cu—Mo, Cu, and the like.

The spacer 131 may be implemented to have a predetermined thickness. Accordingly, the spacer 131 may secure an insulation distance between the first substrate 110 and the second substrate 120, which will be described later, and correct a thickness difference between elements when the power module is manufactured using the elements (the power element 100 and a diode, etc.) having thicknesses different from each other. Also, as the spacer 131 has a predetermined thickness, heat capacity for minimizing an influence of instantaneous heat generated in the power element 100 may be secured.

Figure 2:
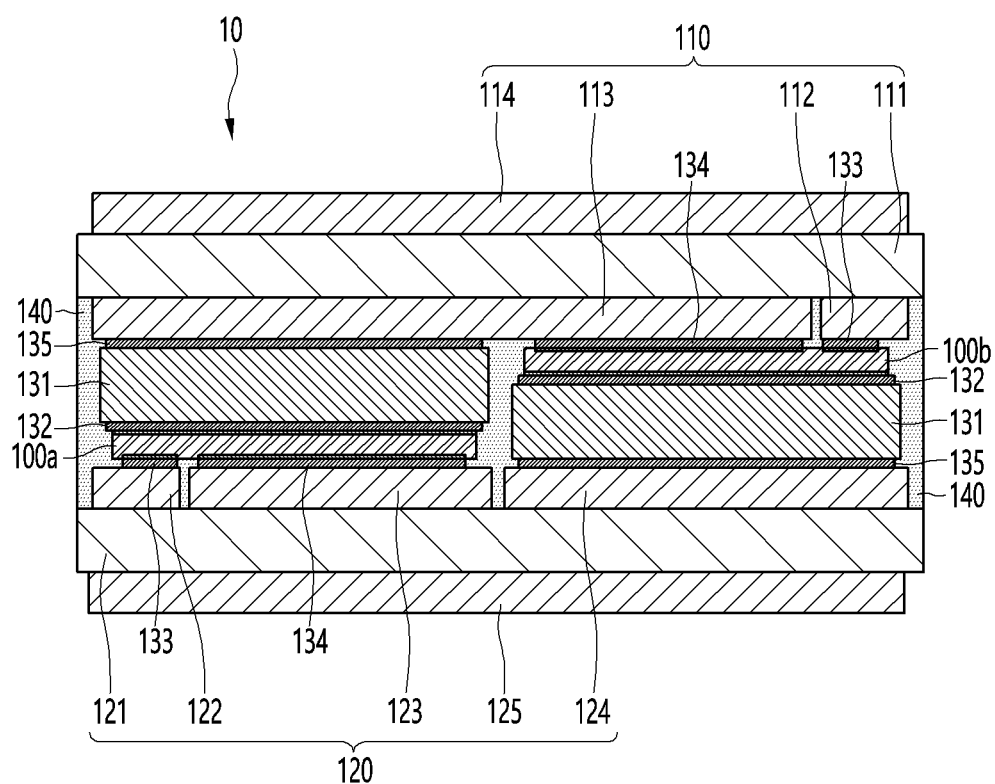
FIG. 2 is a schematic partial cross-sectional view illustrating an example of a structure of a sub module of the power element illustrated in FIGS. 1A to 1C.

FIG. 2 is a schematic partial cross-sectional view illustrating an example structure of a sub module provided in the power element illustrated in FIGS. 1A to 1C.

Referring to FIG. 2, the double-sided cooling type power module may include at least one sub module 10.

The sub module 10 may include a plurality of power elements 100a and 100b, a first substrate 110, and a second substrate 120. In this specification, the first substrate 110 is defined as a substrate disposed on a top surface of the sub module 10, and the second substrate 120 is defined as a substrate disposed on a bottom surface of the sub module 10.

A spacer 131 illustrated in FIG. 1C may be bonded to each of the plurality of power elements 100a and 100b.

The first substrate 110 may have one surface contacting an upper heatsink 30 (see FIG. 13A) and the other surface bonded to the power elements 100a and 100b. The second substrate 120 may have one surface contacting a lower heatsink 20 (see FIG. 12A) and the other surface bonded to the power elements 100a and 100b.

In some examples, where the power elements 100a and 100b may operate at high power during operation, heat generation may be higher than that of another chip or electric circuit. In some examples, the first substrate 110 and the second substrate 120, which are provided in the sub module 10, may have excellent thermal conductivity, high electric current mobility, and high electrical insulation properties when compared to another substrate. Also, each of the first substrate 110 and the second substrate 120 may operate sufficiently even at a high temperature.

In some examples, each of the first substrate 110 and the second substrate 120 may be implemented as a direct bonded copper (DBC) substrate. In this case, the first substrate 110 may include a ceramic plate 111 and metal plates 112, 113, and 114 disposed on both surfaces of the ceramic plate 111. Similar to the first substrate 110, the second substrate 120 may also include a ceramic plate 121 and metal plates 122, 123, 124, and 125 disposed on both surfaces of the ceramic plate 121. Each of the metal plates 112 to 114 and 122 to 125 may be made of copper (Cu). However, the first substrate 110 and the second substrate 120 of the present disclosure are not only implemented as only DBC substrates, but may also be implemented as various known substrates that are capable of being used in the sub module 10.

The first substrate 110 and the second substrate 120 may be provided with the ceramic plates 111 and 121 having the high thermal conductivity between the metal plates 112 to 114 and 122 to 125 to effectively transfer heat generated from the power elements 100a and 100b to external heatsinks 20 and 30.

Each of the plurality of power elements 100a and 100b may include a first power element 100a in which a gate electrode and an emitter electrode are disposed to face the second substrate 120 and a second power element 100b in which a gate electrode 102 and an emitter electrode 103 are disposed to face the first substrate 110. Each of the metal plates 112 to 114 and 122 to 125 may have a specific pattern (or shape) to correspond to the electrodes of the power elements to be bonded.

For example, the metal plates 112 and 113 facing the power elements 100a and 100b among the metal plates 112 to 114 of the first substrate 110 may include a metal plate 112 bonded to the gate electrode 102 of the second power element 100b and a metal plate 113 bonded to the spacer 131 so as to be electrically connected to the collector electrode 104 of the first power element 100a and simultaneously bonded to the emitter electrode 103 of the second power element 100b.

Particularly, the metal plate 113 may be implemented to be electrically connected to the collector electrode 104 of the first power element 100a and the emitter electrode 103 of the second power element 100b. In related art, where the power elements 100a and 100b are disposed to face the same direction, the metal plate 113 may be bonded to each of the power elements 100a and 100b so as to be separated (a high current pattern is separated from each other). However, in the case of the present disclosure, since the metal plate 113 does not have to be separated, the process may be simplified.

Also, since the metal plate 113 electrically connects the collector electrode 104 of the first power element 100*a* to the emitter electrode 103 of the second power element 100*b*, a half bridge circuit may be easily implemented without performing the separate process for the electrical connection.

The metal plates 122 to 124 facing the power elements 100*a* and 100*b* among the metal plates 122 to 125 of the second substrate 120 may include a metal plate 122 bonded to the gate electrode 102 of the first power element 100*a*, a metal plate 123 bonded to the emitter electrode 103 of the first power element 100*a*, ad a metal plate 124 bonded to the spacer 131 so as to be electrically connected to the collector electrode 104 of the second power element 100*b*.

As will be described later in FIG. 4, each of the metal plates 112 and 122 bonded to the gate electrode 102 may have a pattern to be connected to the terminal. That is, since the gate electrodes 102 of the power elements 100*a* and 100*b* are connected to the terminals by the metal plates 112 and 122, a separate wire for connecting the gate electrode to the terminal may not be provided like the related art. Thus, the process of connecting the separate wires may be eliminated to simplify the process and reduce the process time. Also, since the wire is not provided, it is possible to manufacture the more compact sub module 10 and the double-sided cooling type power module.

Bonding portions 133 to 135 provided by printing a bonding material may be disposed between the metal plates 112 to 113 and 122 to 123 and the power elements 100*a* and 100*b* or between the metal plates 113 and 124 and the spacer 131. The bonding portions 133 to 135 may be implemented with a material for transferring the heat generated from the power elements 100*a* and 100*b* to the first substrate 110 and the second substrate 120. For example, the bonding portions 133 to 135 may be implemented with a material such as solder or silver (Ag).

Also, an insulation portion 140 for insulation may be disposed between the first substrate 110 and the second substrate 120. The insulation portion 140 may be provided by molding an insulation material.

Hereinafter, a process of manufacturing the double-sided cooling type power module of the present disclosure will be described with reference to FIGS. 3 to 13B.

Figure 3:
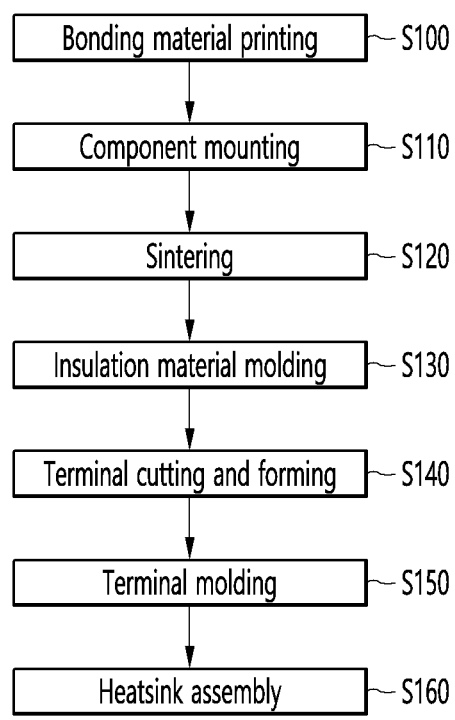
FIG. 3 is a flowchart illustrating an example process for manufacturing a double-sided cooling type power module.

FIG. 3 is a flowchart showing an example process for manufacturing the double-sided cooling type power module of the present disclosure.

Referring to FIG. 3, the process of manufacturing the double-sided cooling type power module may largely include a bonding material printing process, a component bonding process, a terminal forming process, and a heatsink assembly process.

For example, the bonding material printing process may include operation S100, the component bonding process may include operations S110 to S130, the terminal forming process may include operations S140 to S150, and the heatsink assembly process may include operation S160.

Hereinafter, each operations will be described.

First, the bonding material may be printed on each of the first substrate 110 and the second substrate 120 (S100).

In order to bond the plurality of power elements 100, diodes, and a lead frame provided in a sub module 10 between a first substrate 110 and a second substrate 120, the bonding material may be printed on each of the first substrate 110 and the second substrates 120. If assuming that the first substrate 110 corresponds to an upper substrate, and the second substrate 120 corresponds to a lower substrate, the bonding material may be applied to each of a bottom surface of the first substrate 110 and a top surface of the second substrate 120. The bonding material may include silver (Ag), solder, or the like, as described above. Since the bonding material is printed, bonding portions 133 to 135 may be formed on each of the first substrate 110 and the second substrate 120.

Next, components may be mounted on the second substrate 120 (S110).

The components may include the plurality of power elements, the plurality of diodes, and a lead frame. Each of the components may be mounted on a bonding position on the second substrate 120. Here, the first power element 100*a* may be mounted so that the first electrodes 102 and 103 face the second substrate 120, and the second power element 100*b* may be mounted so that the second electrode 104 faces the second substrate 120.

After the components are mounted, sintering of the substrates 110 and 120 and the components may be performed (S120). In some examples, sintering may include heating the substrates 110 and 120 with the bonding material thereon or applying pressure to the substrates 110 and 120.

For example, as the sintering is performed, the first substrate 110 and the second substrate 120 may be pressed toward each other, and each of the bonding portions 133 to 135 may be heated to a predetermined temperature. Thus, the substrates 110 and 120 and the components may be bonded to each other. In the case of the present disclosure, since the separate wire is not provided, all of the substrates 110 and 120 and the components may be bonded through one sintering operation. In some examples, the predetermined temperature may be less than a melting point of the bonding portions 133. In other examples, the predetermined temperature may be greater than or equal to the melting point of the bonding portions 133.

Next, an insulation material may be molded between the first substrate 110 and the second substrate 120 (S130).

After the sintering is performed, the insulation material may be molded between the first substrate 110 and the second substrate 120 to secure an insulation withstanding voltage of the power element 100. In addition, as the insulation material is molded, since the power element 100 may not be exposed to the outside, the power element 100 may be effectively protected.

Thereafter, among the lead frame including the signal pins and terminals, remaining portions excluding the signal pins and terminals may be cut, and the signal pins and terminals may be formed in a preset shape (S140).

The lead frame may include a plurality of signal pins and terminals and a frame to which the signal pins and terminals are fixed. After the lead frame is bonded to the substrates 110 and 120, since the signal pins and terminals are fixed to the substrates 110 and 120, the frame may be cut and removed.

Thereafter, each of the signal pins and terminals may be formed (for example, bent) in a preset shape.

When the signal pins and terminals are formed, the insulation material may be molded to insulate the signal pins and terminals (S150). As operation S150 is performed, the manufacturing of the sub module 10 provided in the double-sided cooling type power module may be completed.

Figure 13A:
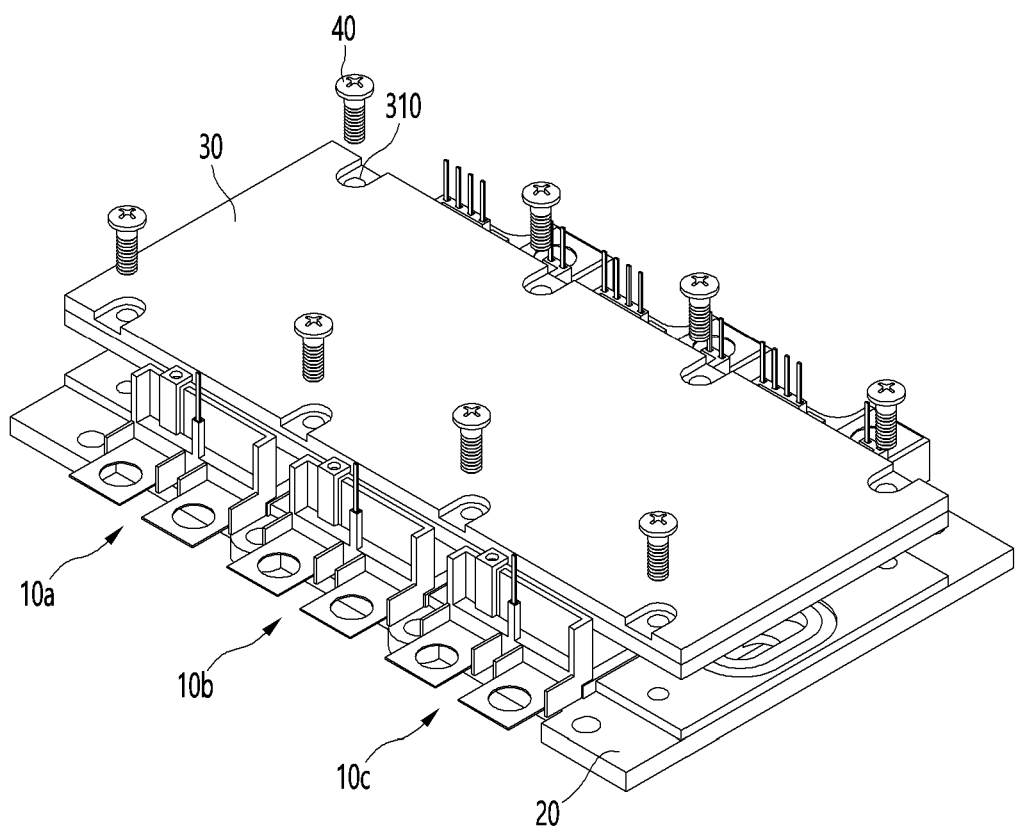
Figure 13B:
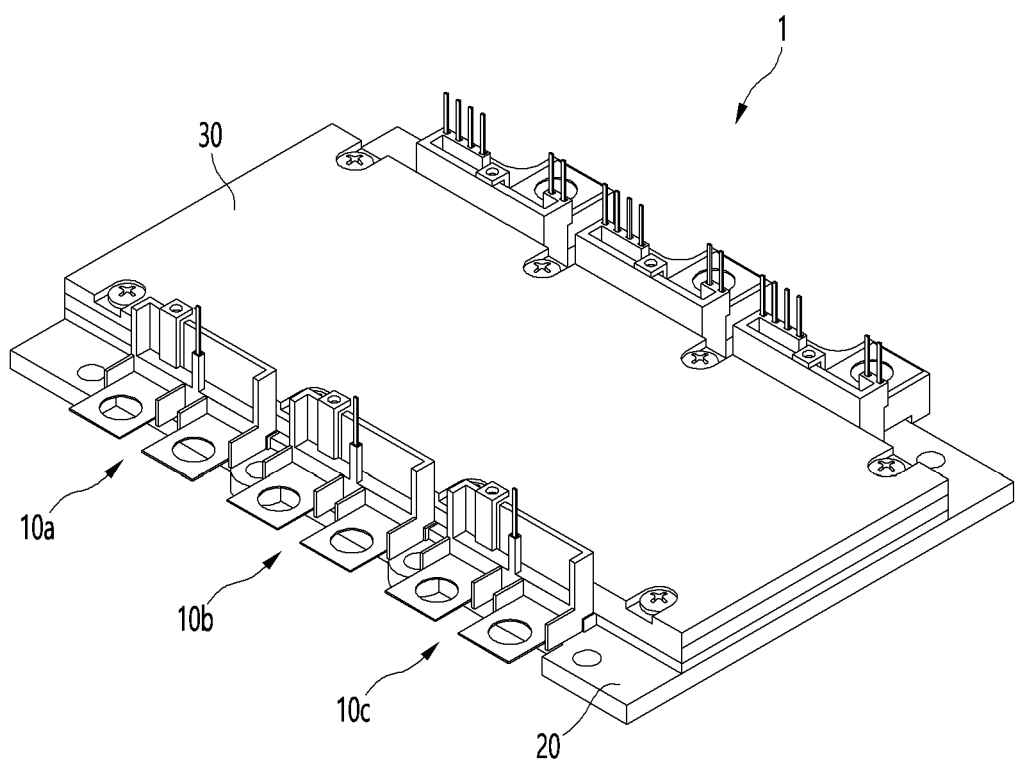

For example, a plurality of sub modules 10 may be provided in the double-sided cooling type power module 1 (see FIG. 13B).

A heatsink may be assembled on each of both surfaces of each of the plurality of sub modules 10 (S160), and as a result, the double-sided cooling type power module 1 (see FIG. 13B) may be manufactured.

Hereinafter, the process of manufacturing the double-sided cooling type power module will be described in more detail with reference to FIGS. 4 to 13B.

FIGS. 4 to 13B are views illustrating example stages of the process of manufacturing the double-sided cooling type power module illustrated in FIG. 3.

Figure 4:
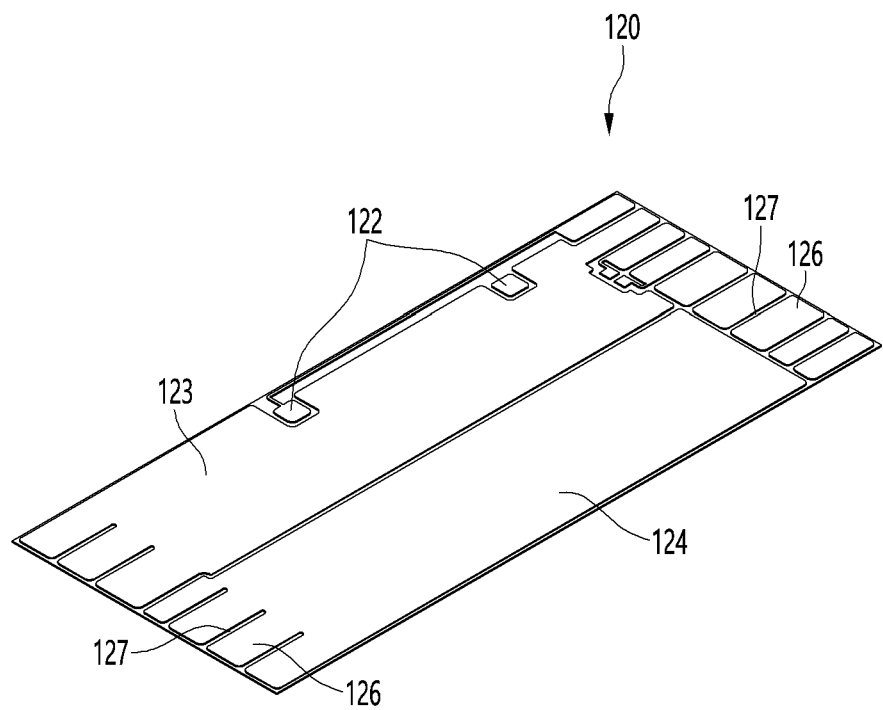
FIGS. 4 to 13B are exemplary views illustrating example stages of the process of manufacturing the double-sided cooling type power module illustrated in FIG. 3.

Referring to FIG. 4, metal plates 122 to 124 and 126 may be formed on the top surface of the second substrate 120 corresponding to the lower substrate.

As described above with reference to FIG. 2, the metal plate 122 bonded to the gate electrode 102 of the power element 100, the metal plate 123 bonded to the emitter electrode 103, and the metal plate 124 bonded to the spacer 131 so as to be connected to the collector electrode 104 may be formed on the top surface of the second substrate 120. Also, at least one metal plate 126 that is bonded to the signal pin and terminal may be formed on the top surface of the second substrate 120. At least one metal plate 126 may be connected to the metal plates 123 and 124 or may have a shape spaced apart from the metal plates 123 and 124.

A portion of the metal plate 122 that is bonded to the gate electrode 102 may be bonded to the gate electrode 102, and the other portion may be connected to the signal pin or terminal. That is, the metal plate 122 may electrically connect the gate electrode 102 to the signal pin (or terminal). Thus, the gate electrode 102 and the signal pin may be connected without the wire provided in the power module 1 according to the related art.

Heat may be generated in at least one metal plate 126 that is bonded to the signal pin and terminal as current flows through the signal pin and terminal. In this case, stress may occur according to a difference in thermal expansion coefficient between the ceramic plate 121 and the metal plate 126, and the second substrate 120 may be bent or curved due to the stress, and thus, the components may be broken or damaged.

To prevent this, a plurality of slits 127 may be formed in the metal plate 126 that is bonded to the signal pin and terminal. As illustrated in FIG. 4, the metal plate 126 may be divided into a plurality of plates, or a plurality of gaps may be formed in the metal plate in a predetermined direction due to the slits 127.

When the metal plate 126 is expanded, each of the gaps may decrease in width due to the slits 127, and thus, the bending or warpage of the second substrate 120 may be minimized. As a result, the components of the second substrate 120 may be prevented from being broken or damaged.

In some examples, a metal plate corresponding to the metal plate 126 may be provided on a bottom surface of the first substrate 110 corresponding to the upper substrate, and a plurality of slits may be formed in the metal plate.

Figure 5:
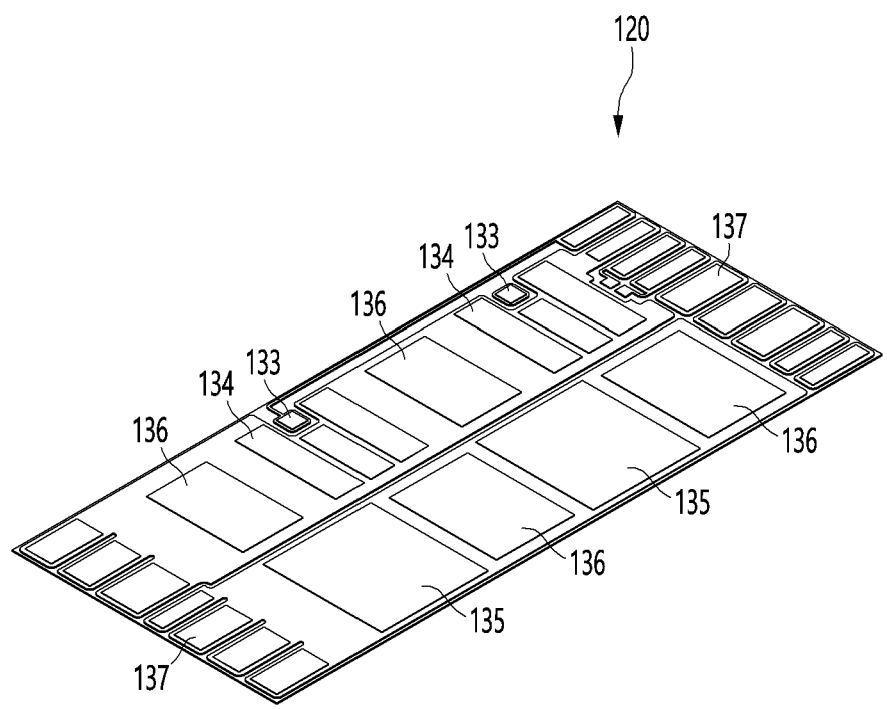

Referring to FIG. 5, a bonding material may be printed on the metal plates 122 to 124 and 126. As the bonding material is printed, bonding portions 133 to 137 may be formed on the second substrate 120. As described above, the bonding material may include a material such as silver (Ag) or solder.

As described above with reference to FIG. 2, the bonding portions 133 to 137 may include the bonding portion 133 bonding the gate electrode 102 of the power element 100 to the metal plate 122, the bonding portion 134 bonding the emitter electrode 103 to the metal plate 123, and the bonding portion 135 bonding the collector electrode 104 to the metal plate 124. Also, the bonding portions 133 to 137 may include a bonding portion 136 bonding the diodes to the metal plates 123 and 124 and a bonding portion 137 bonding the lead frame (the signal pins and terminals) to the metal plate 126.

The bonding portions 133 to 137 may bond the power element 100, the diodes, and the lead frame between the first substrate 110 and the second substrate 120 because a pressure and heat are applied in the sintering process.

Figure 6:
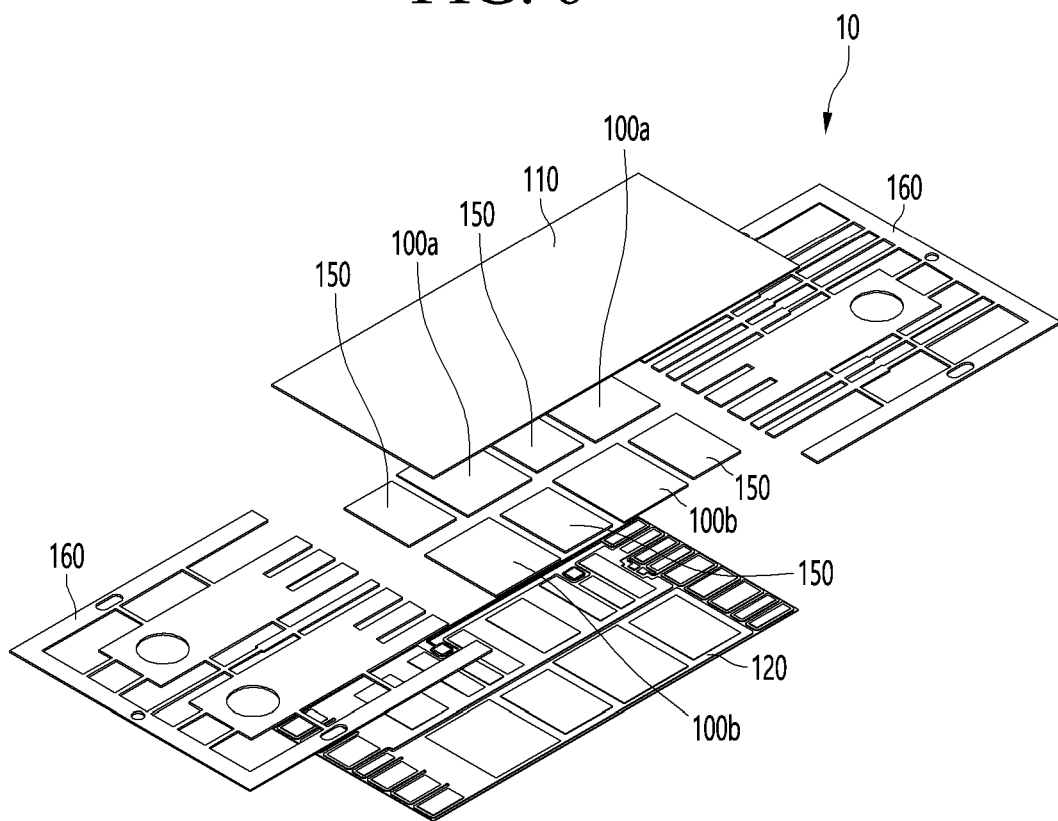
Figure 7:
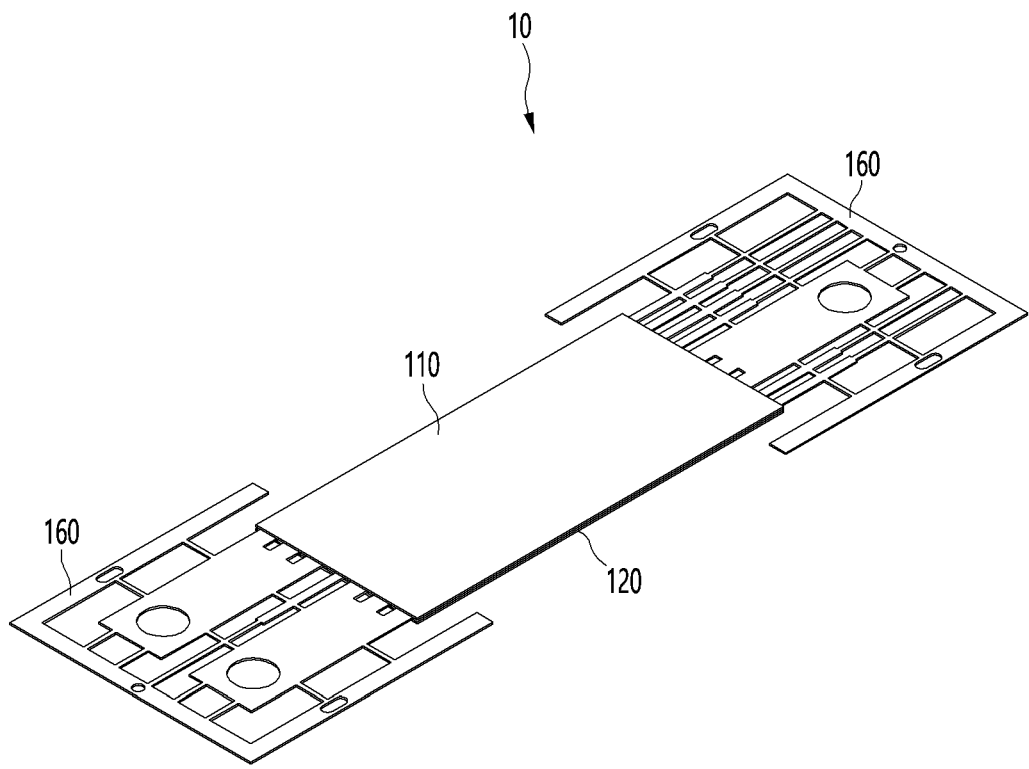

Referring to FIGS. 6 and 7, after the bonding material is printed on the first substrate 110 and the second substrate 120, the components (the power elements 100a and 100b), the diodes 150, and the lead frame 160 may be mounted on the first substrate 110 and the second substrate 120.

As the sintering process is performed after the components are mounted, the first substrate 110, the components, and the second substrate 120 may be bonded to each other. Particularly, since the sub module 10 of the present disclosure is not provided with the wire, it is possible to bond the substrates 110 and 120 to the components through only one sintering process.

Figure 8:
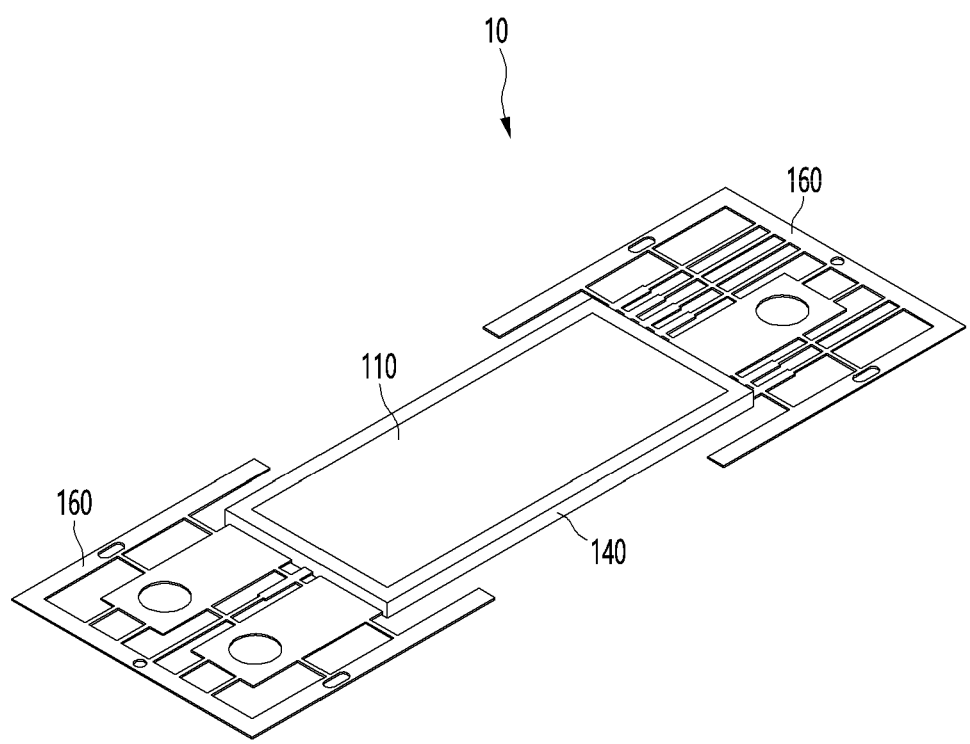

Referring to FIG. 8, after the substrates 110 and 120 and the components are bonded to each other, an insulation portion 140 may be formed as the insulation material is molded between the first substrate 110 and the second substrate 120. For example, the insulation portion 140 may include a material such as epoxy molding compound (EMC). The EMC may be a material containing a plurality of raw materials such as silica, an epoxy resin, a phenol resin, carbon black, flame retardant, and the like.

As the insulation portion 140 is formed, the insulation withstanding voltage of the power elements 100a and 100b may be secured, and the power elements 100a and 100b may be effectively protected from external moisture, foreign substances, and shock.

Figure 9:
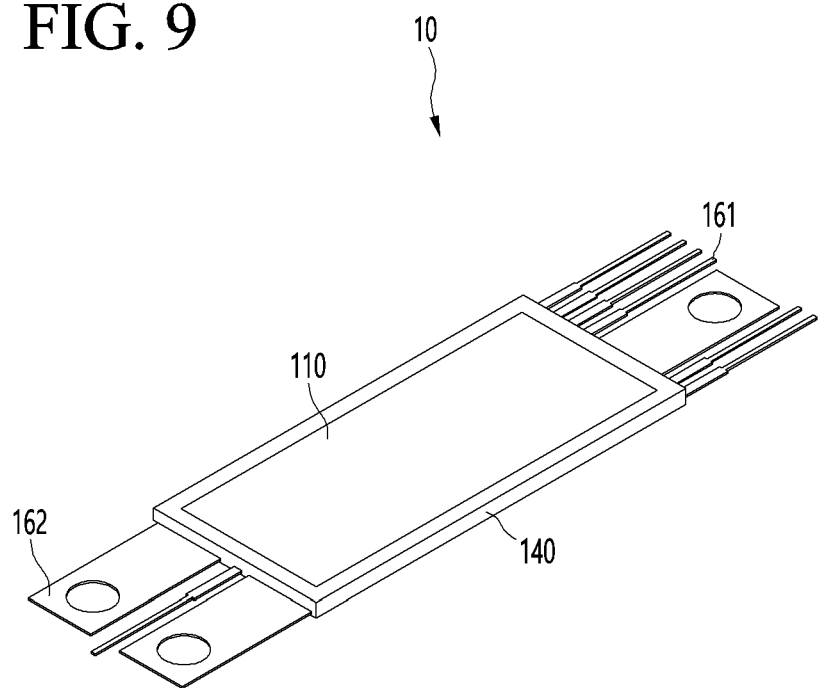
Figure 10:
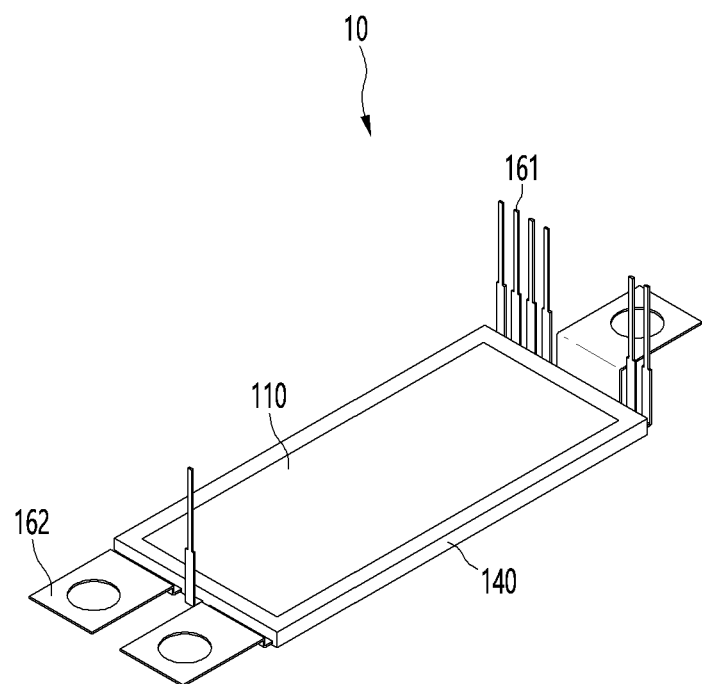
Figure 11:
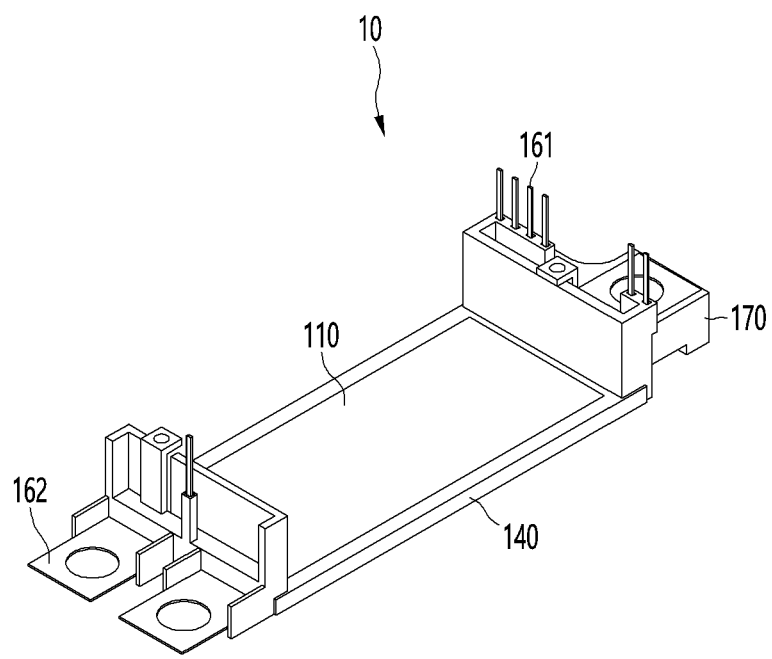

Referring to FIGS. 9 to 11, a frame portion except for the signal pin 161 and terminal 162 in the lead frame 160 may be removed (cut), and the signal pin 161 and terminal 162 may be formed (bent) in a preset shape.

After the signal pin 161 and terminal 162 are formed, the insulation material may be molded to secure the insulation of the signal pins 161 and terminals 162, thereby forming a signal pin and terminal insulation portion 170.

Since the signal pin and terminal insulation portion 170 is formed, the sub module 10 may be manufactured.

Referring to FIGS. 12A to 13B, a plurality of sub modules 10a to 10c may be coupled between a lower heatsink 20 and an upper heatsink 30, and thus, the power module 1 may be manufactured. In this specification, the power module 1 includes three sub modules 10a to 10c, but the number of sub modules provided in the power module 1 is not limited thereto.

Figure 12A:
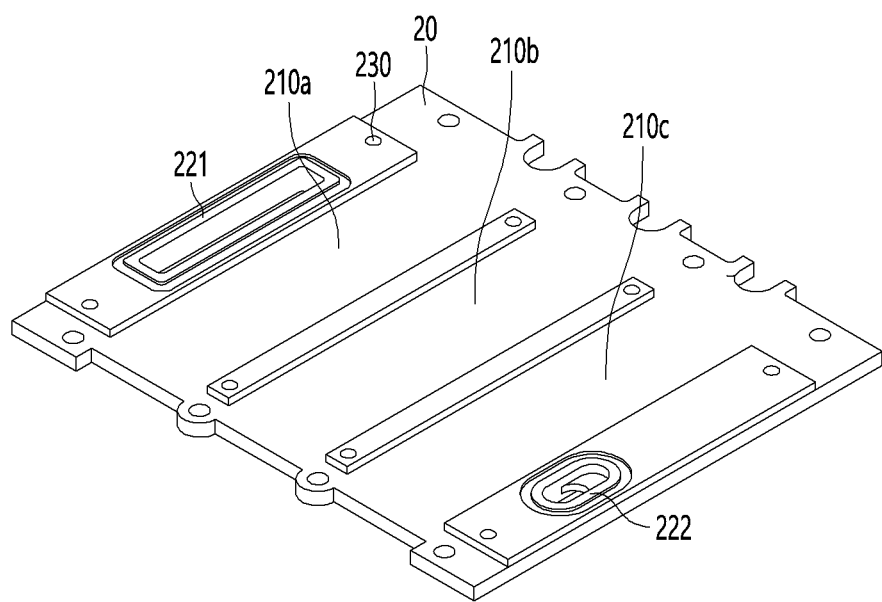

Specifically, referring to FIG. 12A, the lower heatsink 20 may include seating portions 210a to 210c on which the sub modules 10a and 10c are seated and a plurality of coupling grooves 230 coupled to the upper heatsink 30.

The lower heatsink 20 may define a lower portion of the double-sided cooling type power module 1 and shield lower portions of the sub modules 10a to 10c from the outside.

In some implementations, the lower heatsink 20 and the upper heatsink 30 may form a space in which cooling water flows. For example, the cooling water may flow into a space of the lower heatsink 20 through a cooling water inflow hole and then flow to a space of the upper heatsink 30 through a first passage 221 formed in the lower heatsink 20. The cooling water flowing into the space in the upper heatsink 30 may flow to the lower heatsink 20 through a second passage 222, and the cooling water flowing to the lower heatsink 20 may be discharged to the outside through a cooling water discharge hole.

Accordingly, the heat generated in the sub modules 10a to 10c may be conducted to the upper heatsink 30 and the lower heatsink 20 by a heat conduction phenomenon. When the cooling water flows into the space inside the upper heatsink 30 and the lower heatsink 20, as the heat conducted to the upper heatsink 30 and the lower heatsink 20 is conducted again to the cooling water, the upper heatsink 30 and the lower heatsink 20 may decrease in temperature. Thereafter, the heat of the sub modules 10a to 10c may be again conducted to the upper heatsink 30 and the lower heatsink 20, and thus, the sub modules 10a to 10c may decrease in temperature.

Figure 12B:
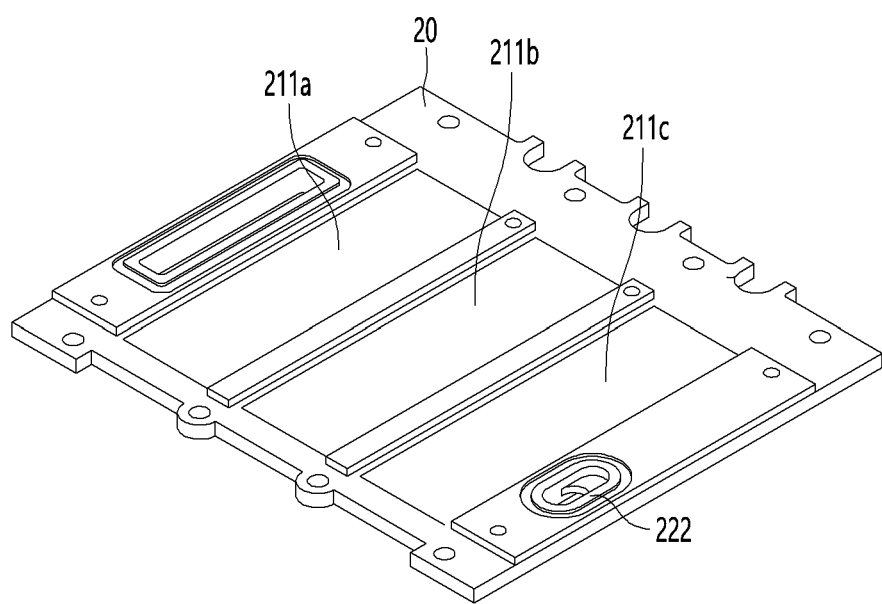

Referring to FIG. 12B, a heat dissipation material may be printed on the seating portions 210a to 210c of the lower heatsink 20. For example, the heat dissipation material may include a thermal interface material (TIM) such as thermal grease or a thermally conductive adhesive. As the heat dissipation material is printed, heat dissipation portions 211a to 211c may be formed. In some examples, the heat dissipation portions may be formed to also correspond to the upper heatsink 30.

Figure 12C:
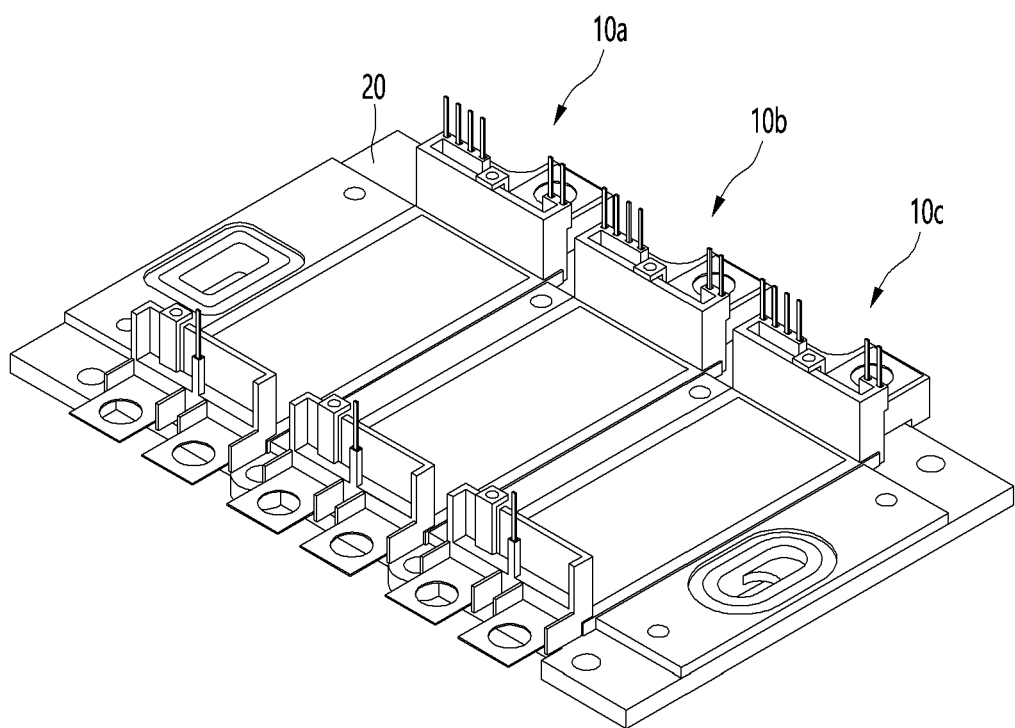

Referring to FIG. 12C, after the heat dissipation material is printed, the sub modules 10a to 10c may be seated (or mounted) on the seating portions 210a to 210c.

Referring to FIG. 13A, after the sub modules 10a to 10c are seated on the seating portions 210a to 210c, the upper heatsink 30 may be assembled. The upper heatsink 30 may form an upper portion of the double-sided cooling type power module 1 and shield the upper portions of the sub modules 10a to 10c from the outside.

For example, a coupling groove 310 corresponding to the coupling groove 230 of the lower heatsink 20 may be formed in the upper heatsink 30. A coupling screw 40 may pass through the upper heatsink 30 and then be inserted into and fixed to the coupling groove 230 of the lower heatsink 20 through the coupling groove 310 formed in the upper heatsink 30. Accordingly, the upper heatsink 30 may be assembled with the lower heatsink 20.

The detailed description is intended to be illustrative, but not limiting in all aspects. It is intended that the scope of the present disclosure should be determined by the rational interpretation of the claims as set forth, and the modifications and variations of the present disclosure come within the scope of the appended claims and their equivalents.

What is claimed is:

1. A power module comprising:
a first substrate comprising a first metal plate disposed at a first side of the first substrate;
a second substrate spaced apart from the first substrate, the second substrate comprising a second metal plate that is disposed at a second side of the second substrate and faces the first metal plate; and
a plurality of power elements disposed between the first substrate and the second substrate, wherein the plurality of power elements comprise insulated gate bipolar transistor (IGBT) semiconductor elements, each of the plurality of power elements comprising:
a first electrode disposed at a first surface of each of the plurality of power elements, wherein the first electrode comprises a gate electrode and an emitter electrode of one of the IGBT semiconductor elements, and
a second electrode disposed at a second surface of each of the plurality of power elements, wherein the second electrode comprises a collector electrode of the one of the IGBT semiconductor elements, wherein the plurality of power elements comprise:
a first power element having the gate electrode and the emitter electrode that are coupled to the second metal plate,
a first spacer disposed between the first metal plate and the first power element and coupled to the first metal plate, wherein the first spacer is coupled to the collector electrode of the first power element,
a second power element having the gate electrode and the emitter electrode that are coupled to the first metal plate, and
a second spacer disposed between the second power element and the second metal plate and coupled to the second metal plate, wherein the second spacer is coupled to the collector electrode of the second power element,
wherein each of the first and second spacers has a thickness predetermined to compensate a thickness difference between the first and second power elements, the first and second power elements having thicknesses different from each other.

2. The power module according to claim 1, further comprising a signal pin and a terminal,
wherein the first and second metal plates comprise a portion bonded to the gate electrode, and another portion bonded to the signal pin or the terminal.

3. The power module according to claim 2, wherein the gate electrode is connected to the signal pin or terminal without a wire.

4. The power module according to claim 1, wherein the first metal plate is electrically connected to the collector electrode of the first power element and the emitter electrode of the second power element.

5. The power module according to claim 4, wherein the first spacer is bonded to the collector electrode of the first power element, and
wherein the first metal plate is bonded to the emitter electrode of the second power element and to the first spacer.

6. The power module according to claim 1, further comprising a signal pin and a terminal,
wherein the first metal plate comprises a plurality of first metal plates, one of the plurality of first metal plates defining at least one first slit and being coupled to the signal pin and the terminal, and
wherein the second metal plate comprises a plurality of second metal plates, one of the plurality of second metal plates defining at least one second slit and being coupled to the signal pin and the terminal.

7. The power module according to claim 6, wherein the one of the plurality of first metal plates comprises a plurality of metal plates divided by the at least one first slit.

8. The power module according to claim 1, wherein the first and second metal plates are disposed at opposing surfaces of the first substrate and the second substrate.

9. The power module according to claim 1, further comprising a signal pin and a terminal that extend outside the first and second substrates, at least one of the signal pin or the terminal being bent with respect to the first substrate or the second substrate.

10. The power module according to claim 1, further comprising an insulation portion that is disposed between the first substrate and the second substrate and covers side surfaces of the first metal plate, the second metal plate, and the plurality of power elements.

11. The power module according to claim 1, wherein the first metal plate comprises a plurality of first metal plates spaced apart from one another and arranged along a first surface of the first substrate, and wherein the second metal plate comprises a plurality of second metal plates spaced apart from one another and arranged along a second surface of the second substrate facing the first surface of the first substrate.

12. The power module according to claim 1, further comprising:

a plurality of bonding portions disposed on at least one of the first spacer, the second spacer, the plurality of power elements, the first metal plate, or the second metal plate.

13. The power module according to claim 12, wherein the plurality of bonding portions comprise:

a first boding portion that couples the first electrode of the first power element to the second metal plate, that couples the second electrode of the first power element to the first spacer, and that couples the first spacer to the first metal plate; and a second boding portion that couples the first electrode of the second power element to the first metal plate, that couples the second electrode of the second power element to the second spacer, and that couples the second spacer to the second metal plate.

14. The power module according to claim 1, wherein the thicknesses of the first and second spacers are greater than the thicknesses of the first and second power elements, respectively.

* * * * *